(12) United States Patent
Gierak et al.

(10) Patent No.: US 11,495,429 B2
(45) Date of Patent: Nov. 8, 2022

(54) ION BEAM GENERATOR WITH NANOWIRES

(71) Applicant: CENTRE NATIONAL DE LA RECHERCHE SCIENTIFIQUE, Paris (FR)

(72) Inventors: Jacques Gierak, Le Plessis-Pate (FR); Noëlle Lebeau, Garches (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 285 days.

(21) Appl. No.: 16/644,905

(22) PCT Filed: Sep. 5, 2018

(86) PCT No.: PCT/EP2018/073897
§ 371 (c)(1),
(2) Date: Mar. 5, 2020

(87) PCT Pub. No.: WO2019/048497
PCT Pub. Date: Mar. 14, 2019

(65) Prior Publication Data
US 2020/0266021 A1 Aug. 20, 2020

(30) Foreign Application Priority Data
Sep. 5, 2017 (FR) .................................. 1758177

(51) Int. Cl.
*H01J 37/08* (2006.01)
*F03H 1/00* (2006.01)
(52) U.S. Cl.
CPC ............ *H01J 37/08* (2013.01); *F03H 1/0037* (2013.01); *H01J 2237/0802* (2013.01); *H01J 2237/317* (2013.01)

(58) Field of Classification Search
CPC ........ H01J 27/26; H01J 35/065; H01J 29/025; H01J 29/62; H01J 29/46; H01J 37/08;
(Continued)

(56) References Cited

U.S. PATENT DOCUMENTS 6,459,082 B1 * 10/2002 Sakaguchi ............. H01J 37/08
850/43
7,696,680 B2 * 4/2010 Wei ....................... H01J 31/126
313/495

(Continued)

FOREIGN PATENT DOCUMENTS

WO 2016164004 10/2016

OTHER PUBLICATIONS

Toda et al., "Fabrication of Gate-Electrode Integrated Carbon-Nanotube Bundle Field Emitters", NASA Tech Briefs, Apr. 2008, pp. 15-16, NPO-4496, NASA's Jet Propulsion Laboratory, Pasadena, California.

(Continued)

*Primary Examiner* — Tung X Le
(74) *Attorney, Agent, or Firm* — Greer, Burns & Crain, Ltd

(57) ABSTRACT

An ion beam generator includes an emission electrode, an extraction electrode, and an electricity generator. The emission electrode includes a substrate and a plurality of nanowires extending away from the substrate, substantially towards the extraction electrode, the nanowires having a length of 50 nm to 50 μm. The emission electrode has a source of ions including a sheet of ionic liquid formed on the substrate and at least partially immersing the nanowires. The nanowires and the substrate are electrically insulating or semiconducting, and the electricity generator is connected to (Continued)

the sheet of ionic liquid. The emission electrode is thus capable of sending ion beams from the ionic liquid to the extraction electrode.

13 Claims, 3 Drawing Sheets

(58) Field of Classification Search
CPC .. H01J 49/068; H01J 49/167; H01J 2237/317; H01J 2237/0802
See application file for complete search history.

(56) References Cited

U.S. PATENT DOCUMENTS

| | | | | |
|---|---|---|---|---|
| 8,447,013 B2* | 5/2013 | Sprenger | ................. | H01J 35/04 |
| | | | | 378/136 |
| 8,472,586 B2* | 6/2013 | Ueda | ................. | H01J 35/16 |
| | | | | 378/124 |
| 9,922,793 B2* | 3/2018 | Hori | ................. | H01J 31/28 |
| 2006/0272776 A1* | 12/2006 | Horsky | ................. | C23C 14/48 |
| | | | | 156/345.37 |
| 2007/0111628 A1* | 5/2007 | Yagi | ................. | H01J 9/025 |
| | | | | 445/24 |
| 2007/0247049 A1* | 10/2007 | Li | ................. | H01J 1/304 |
| | | | | 313/311 |
| 2010/0181493 A1 | 7/2010 | Sudraud et al. | | |
| 2011/0147577 A1* | 6/2011 | Kovtoun | ................. | H01J 49/068 |
| | | | | 250/288 |
| 2011/0192968 A1 | 8/2011 | Makarov et al. | | |
| 2011/0210265 A1 | 9/2011 | Lozano et al. | | |
| 2014/0353860 A1* | 12/2014 | Velasquez-Garcia | ................. | B05D 1/007 |
| | | | | 239/548 |

OTHER PUBLICATIONS

Fedorov et al., "Doube-layer in ionic liquids: The nature of the Camel Shape of Capacitance", Electrochemistry Communications 12, 2010, pp. 296-299, Elsevier B.V.
Sir Geoffrey Taylor, F.R.S., "Disintegration of water drops in an electric field", Proc. Roy. Soc. A, pp. 383-397, vol. 280, Plate 23.
Wan et al., "Carbon nanotubes grown by gas source molecular beam epitaxy", Journal of Crystal Growth 227-228, 2001, pp. 820-824, Elsevier Science B.V.
Hill et al., "High Throughput Ionic Liquid Ion Sources Using Arrays of Microfabricated Electrospray Emitters With Integrated Extractor Grid and Carbon Nanotube Flow Control Structures", Journal of Microelectromechanical Systems, Oct. 2014, pp. 1237-1248, vol. 23, No. 5, IEEE.
Manohara et al., "Arrays of Bundles of Carbon Nanotubes as Field Emitters", NASA Tech Briefs, Feb. 2007, pp. 26-27, NPO-40817.
Liliental-Weber et al., "Formation Mechanism of Nanotubes in GaN", Physical Review Letters, Oct. 13, 1997, vol. 79, No. 15, pp. 2835-2838, The American Physical Society.
Wang et al., "A new approach to epitaxially grow high-quality GaN films on Si substrates: the combination of MBE and PLD", Scientific Reports 6:24448, Apr. 22, 2016, pp. 1-11, Nature.com.
French Search Report from the corresponding French Patent Application No. 1758177, dated Jun. 26, 2018.
International Search Report from the corresponding International Patent Application No. PCT/EP2018/073897, dated Nov. 7, 2018.

* cited by examiner

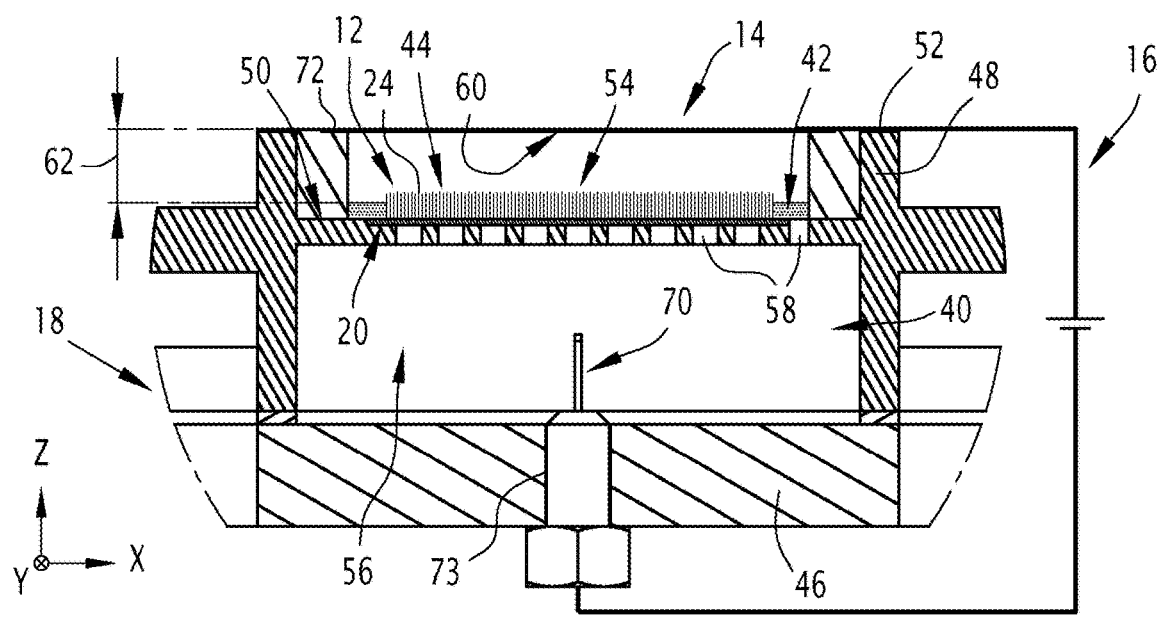
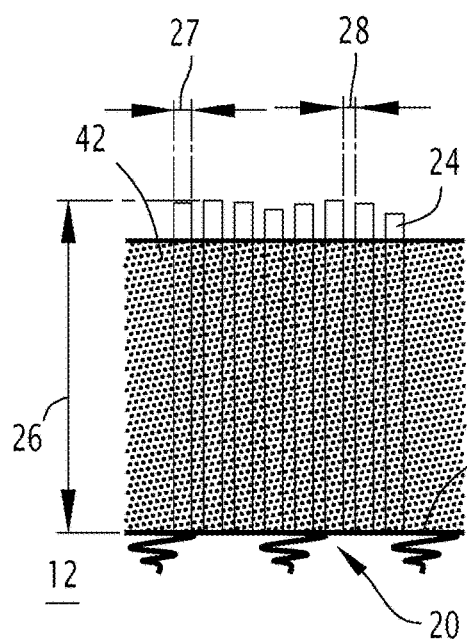
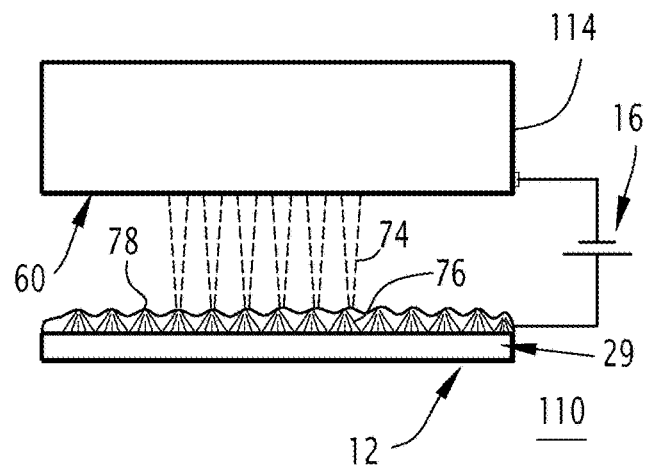
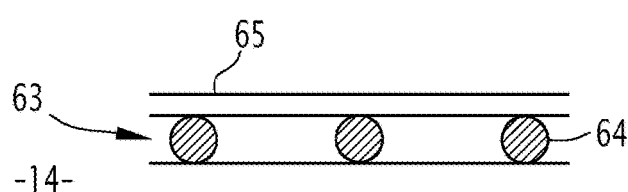
FIG.1
FIG.2
FIG.4
FIG.3

ION BEAM GENERATOR WITH NANOWIRES

BACKGROUND

The present invention relates to an ion beam generator of the type comprising: an emission electrode, comprising a first main surface; an extraction electrode comprising a second main surface arranged substantially facing the first main surface, said first and second main surfaces being separated by a gap; and an electrical generator capable of applying a potential difference between the emission electrode and the extraction electrode; the emission electrode comprising an ionic liquid ion source, said emission electrode thus being capable of sending to the extraction electrode at least one beam of ions originating from said ionic liquid.

Ion beam generators relate to various technical fields such as nanoscale etching on integrated circuits, as described in the document WO2009/027596, or the manufacture of thrusters for small satellites, as described in the document WO2016/164004.

It is known to use an ionic liquid ion source for these generators. Ionic liquids are salts having a melting temperature lower than 100° C., or even lower than ambient temperature. They are therefore in the liquid state without requiring heating. Moreover, their very low saturation vapour pressure allows them to remain liquid under high vacuum.

In order to emit an ion beam from an ionic liquid, it is conventional to hold a quantity of liquid on the point of a metal needle, then to apply a voltage between said needle, or emission electrode, and another electrode, known as an extraction electrode. The extraction voltage generates an emission of ions by a field evaporation mechanism. The electric field applied to the ionic liquid results in its deformation in the form of a conical meniscus referred to as a Taylor cone as described in the document *Proc. R. Soc. Lond.* A 280 (1964) 383-397, or in the document WO2009/137583.

The ions are detached from the point of the Taylor cone to form a beam in the direction of the extraction electrode. In the case of an ion thruster it is known to use a field of substantially identical needles, the extraction electrode being constituted by a perforated wall through which the different beams formed at the point of each needle pass.

The known devices have several drawbacks. The fields of needles used for the ion thrusters are generally produced by etching of a block of conductive material such as graphite, or "top-down" approach. Such a method makes it difficult to obtain needles of an identical shape and length, which affects the homogeneity of the ion beams obtained.

Moreover, during the emission, a layer of counter ions is formed, which accumulate on the surface of the needles made of conductive material, as described for example in the document Fedorov et al., *Electrochemistry communications* 12 (2010) 296-299. This phenomenon causes the efficiency of the generator to decrease rapidly. In the document WO2016/164004, the introduction of a remote polarizing electrode in order to combat the formation of such a layer is described. However, this solution produces poor results.

Furthermore, the known devices do not allow the ionic liquid to be efficiently circulated to the tip of the Taylor cones. This results in the liquid being depleted of emitted ions and, conversely, a saturation with counter ions. The ion current obtained therefore diminishes rapidly.

A solution to this problem is to reverse the polarity between the electrodes. The counter ions then become the emitted ions. However, the frequent reversal of the polarities reduces the operational efficiency of the generators, due to down times necessary for depolarization/reverse repolarization.

A subject of the present invention is to solve these problems and to provide an efficient ion beam generator over the long term and allowing the emission of high-intensity ion currents.

SUMMARY

To this end, a subject of the invention is an ion beam generator of the abovementioned type, in which: the emission electrode comprises a substrate and a plurality of nanowires extending from said substrate, substantially in the direction of the extraction electrode, each of said nanowires having a length comprised between 50 nm and 50 µm, preferentially comprised between 100 nm and 1 µm, each of said nanowires having a diameter comprised between 50 nm and 200 nm, a minimum distance between two adjacent nanowires on the substrate being comprised between 50 nm and 200 nm and preferentially equal to approximately 150 nm; the ionic liquid ion source comprises a layer of ionic liquid formed on the substrate and at least partially immersing the nanowires, said layer of ionic liquid thus at least partially forming the first main surface; and the plurality of nanowires and the substrate are electrically insulating or semiconducting, the electrical generator being connected to the layer of ionic liquid.

According to other advantageous aspects of the invention, the ion beam generator comprises one or more of the following characteristics, taken in isolation or according to all the technically possible combinations:

the nanowires of the emission electrode are obtained by adding material to the substrate, said nanowires being preferentially produced by molecular beam epitaxy;

the nanowires are formed from a material selected from GaN, AlN, InN, GaInN and AlGaN;

the substrate of the emission electrode is formed from a material comprising silicon;

the nanowires extend from a substantially flat surface of the substrate;

the ionic liquid is an onium salt, preferentially selected from 3-ethyl-1-methylimidazolium tetrafluoroborate and 3-ethyl-1-methylimidazolium bis(trifluoromethylsulfonyl) imide;

the gap separating the first and second main surfaces has a length comprised between 100 nm and 50 µm, preferentially comprised between 500 nm and 10 µm;

the length of a nanowire is comprised between 100 nm and 1 µm; the diameter of a nanowire is approximately 50 nm; the minimum distance between two adjacent nanowires on the substrate is approximately 150 nm; and a Young's modulus of the nanowires is greater than or equal to 120 GPa and preferentially of the order of 150 GPa;

the extraction electrode comprises a grid preferentially formed from woven wires;

the extraction electrode comprises a sheet capable of being perforated by an ion beam originating from the emission electrode;

the emission electrode is arranged in a compartment closed in a sealed manner by the sheet.

The invention furthermore relates to an ion thruster comprising an ion beam generator as described above.

BRIEF DESCRIPTION OF THE DRAWINGS

The invention furthermore relates to a nanofabrication device comprising an ion beam generator as described above.

The invention will be better understood on reading the following description, given solely by way of non-limitative example and produced with reference to the drawings in which:

FIG. 1 is a diagrammatic cross-section representation of an ion beam generator according to a first embodiment of the invention, before a first emission of ion beams;

FIG. 2 and FIG. 3 are diagrammatic detail views of the generator of FIG. 1;

FIG. 4 is a diagrammatic representation of an ion beam generator according to a second embodiment of the invention, during an emission of ion beams;

DETAILED DESCRIPTION

Figure 5:
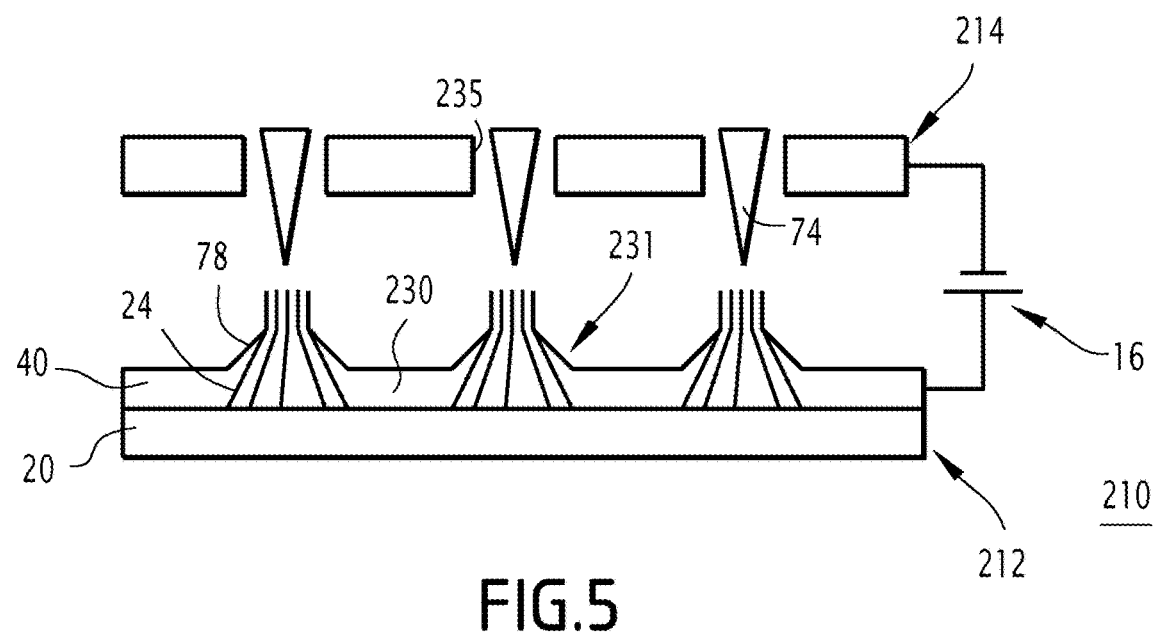
FIG. 5 is a diagrammatic representation of an ion beam generator according to a third embodiment of the invention, during an emission of ion beams.

Each of FIGS. 1, 4 and 5 diagrammatically represents an ion beam generator 10, 110, 210, according to a first, a second and a third embodiments of the invention, respectively; FIGS. 2 and 3 show detail views of the generator 10 of FIG. 1.

By way of indication, the generator 10 of FIG. 1 is particularly intended to be incorporated in an ion thruster for the aerospace industry. The generator 110 of FIG. 4 is particularly intended for a nano-fabrication application, for example for integrated circuits.

In the following description, the elements common to the generators 10, 110 and 210 will be denoted by the same reference numbers.

The ion beam generator 10, 110, 210 comprises: an emission electrode 12, 212, an extraction electrode 14, 114, 214 and an electrical generator 16. In the embodiment of FIG. 1, the ion beam generator 10 also comprises a casing 18.

An orthonormal basis (X, Y, Z) is considered. The emission electrode 12, 212 and the extraction electrode 14, 114, 214 are arranged substantially facing one another in direction Z. In the remainder of the description, it is considered that said direction Z represents the vertical and the emission electrode 12, 212 is situated lower than the extraction electrode 14, 114, 214.

FIG. 2 shows a detail view of the emission electrode 12 of FIG. 1. The emission electrode 12, 212 comprises a substrate 20. Said substrate 20 has a substantially flat upper surface 22, extending in particular in a plane (X, Y).

The substrate 20 is formed from an electrically insulating or semiconducting material, preferably crystalline. The material of the substrate 20 preferentially comprises silicon, made insulating by a nitriding process or surface oxidation.

The emission electrode 12, 212 also comprises a plurality of nanowires 24, extending substantially along Z from said upper surface 22. In FIG. 1, the nanowires 24 are shown diagrammatically, enlarged compared with the casing 18.

Nanowires denote filiform nanostructures, the diameter of which is on the nanoscale. In the embodiments represented, the nanowires 24 have a length 26 comprised between 50 nm and 50 µm, preferentially comprised between 100 nm and 1 µm. Moreover, the nanowires 24 preferably have a diameter 27 comprised between 50 nm and 200 nm.

A maximum distance 28 between two adjacent nanowires on the substrate 20 is preferentially comprised between 50 nm and 200 nm and more preferentially equal to approximately 100 nm.

Like the substrate 20, the nanowires 24 are formed from an electrically insulating or semiconducting material. The material of the nanowires is preferentially selected from GaN, AlN, InN, GaInN and AlGaN;

The nanowires 24 are preferably obtained by adding material to the substrate 20, and not by subtraction of material or "top-down" approach. The addition of material in fact makes it possible to obtain a better homogeneity of the size and shape of the nanowires.

According to an embodiment of the invention, the nanowires are formed by molecular beam epitaxy, from gallium nitride (GaN), on a substrate of crystalline silicon Si<111> surface-treated beforehand. Such a method for the formation of nanowires is known in particular from Largeau et. al., *Nanotechnology* 19 (2008) 155704. An example of this method will be described below.

The upper surface 22 of the substrate 20, covered with nanowires 24, can have a variable surface area depending on the desired use of the generator 10, 110, 210. In the embodiment of FIG. 1, the upper surface 22 has a surface area of approximately 1 cm². The substrate 20 has, for example, the shape of a square with sides of approximately 1 cm.

Similarly, the upper surface 22 can have a contour 29 of variable shape, for example square, rectangular or rounded; in the context of a nano-fabrication application, such as for the generator 110 of FIG. 4, the contour 29 of the substrate 20 in particular defines a shape to be reproduced by nanofabrication as described below.

In the embodiment of FIG. 5, trenches 230 separate different groups 231 of nanowires 24. More precisely, at the level of the trenches 230, the upper surface of the substrate 20 is devoid of nanowires 24. The trenches 230 form, for example, two series of parallel lines defining a two-dimensional grid. The series of parallel lines preferably extend along X and along Y respectively, defining a square grid. According to a variant not represented, the trenches are etched according to another configuration, depending for example on a pattern to be projected.

The emission electrode 12, 212 also comprises an ionic liquid ion source 40. Said ion source comprises a layer 42 of ionic liquid, formed on the upper surface 22 of the substrate 20. The ionic liquid is, for example, an onium salt selected from the compounds used in ionic propulsion, such as EMI-$BF_4$ (3-ethyl-1-methylimidazolium tetrafluoroborate) or EMI-IM (3-ethyl-1-methylimidazolium bis(trifluoromethylsulfonyl)imide) described in the document WO2009/137583.

The nanowires 24 are at least partially immersed in the layer 42. More precisely, the free ends of the nanowires 24 preferentially protrude beyond the layer 42 when the electrical generator 16 is deactivated. The layer 42 is represented diagrammatically, in particular in FIG. 2, without taking into account the phenomena of capillary action with the nanowires.

The layer 42 of ionic liquid thus forms a first main surface 44 of the emission electrode 12, said first main surface 44 being intended to emit one or more beams of ions.

The casing 18 of the generator 10 will now be described in the context of the embodiment of FIG. 1. The casing 18 comprises a base 46, side walls 48 and an intermediate wall 50. In the embodiment of FIG. 1, the intermediate wall 50 and the side walls 48 are formed from an electrically insulating material, preferably a plastic such as acrylonitrile butadiene styrene (ABS).

The base 46 and the intermediate wall 50 extend substantially in the planes (X, Y). The side walls 48 extend parallel to Z from the base 46 to an upper edge 52. The side walls 48 preferably form a square section along (X, Y).

The intermediate wall 50 extends from the side walls 48, between the base 46 and the upper edge 52. The intermediate wall 50 in particular divides the casing 18 between an emission cavity 54 and a reservoir 56, respectively situated above and below said intermediate wall.

The intermediate wall 50 is formed from a microporous material. In FIG. 1, pores 58 of said material are shown diagrammatically, enlarged compared with the casing 18. Said pores 58 place the reservoir 56 and the emission cavity 54 in fluid communication.

An upper face of the intermediate wall 50 is fixed to a lower face of the substrate 20. Said substrate 20 and the nanowires 24 are thus received in the emission cavity 54; the intermediate wall 50 forms a support for the substrate 20/nanowires 24 assembly.

As will be described in detail below, the reservoir 56 is intended to receive a quantity of ionic liquid 40 to form the layer 42, by diffusion of said liquid through the pores 58. In particular, in the embodiment of FIG. 1, the side walls 48 and the intermediate wall 50 are formed in one piece, while the base 46 of the reservoir 56 is removable.

The extraction electrode 14, 114, 214 is formed from an electrically conductive or semiconducting material. The extraction electrode 14, 114, 214 comprises, for example, a metal, in particular tungsten or stainless steel. According to variants, the extraction electrode 14, 114, 214 comprises a non-metallic conductive material such as graphene and/or a semiconducting material such as silicon.

The extraction electrode 14, 114, 214 has a second main surface 60 arranged facing the first main surface 44. In the embodiments of FIGS. 1, 4 and 5, the second main surface 60 is substantially arranged in a plane (X, Y). According to variants that are not represented, the second main surface can have a non-planar form.

The first and second main surfaces are separated by a gap 62, of an order of magnitude along Z ranging from a few hundreds of nanometres to a few tens of micrometres. The gap 62 preferably has a length along Z comprised between 100 nm and 50 µm, more preferentially comprised between 500 nm and 10 µm;

In particular, in the embodiment of FIG. 1, the extraction electrode 14 is fixed to the upper edge 52 of the side walls 48 of the casing 18. Said casing is configured so as to obtain the desired length for the gap 62.

FIG. 3 shows a detail view of the extraction electrode 14 of FIG. 1, represented in cross-section. The extraction electrode 14 comprises a grid 63 of metal wires 64, said grid extending in a plane (X, Y).

The metal wires 64, of stainless steel for example, have in particular a diameter of the order of from approximately ten to approximately one hundred micrometres. Said metal wires 64 are preferably woven, two adjacent wires being spaced a few hundred micrometres apart.

The extraction electrode 14 also comprises a sheet 65, arranged on the grid 63.

Said sheet 65 is formed from an electrically conductive material such as a metal or graphene. The sheet 65 preferably has a thickness of a few angstroms along Z.

The grid 63 and the sheet 65 are fixed to the upper edge 52 of the side walls 48 of the casing 18. Before the first ionic emission from the generator 10, the sheet 65 is devoid of openings and closes the emission cavity 54 in a gas-tight and liquid-tight manner. As will be described below, the sheet 65 is intended to be perforated by one or more ion beams originating from the emission electrode 12.

According to variants that are not represented, the emission electrode of an ion beam generator according to the invention can be formed by a grid 63 alone or by a sheet 65 alone.

In the embodiment of FIG. 4, the extraction electrode 114 is formed by a sample to be etched or on which a molecular deposition is carried out; the second main surface 60 of said extraction electrode is, for example, constituted by silicon.

In the embodiment of FIG. 5, the extraction electrode 214 is formed by a material defining a network of capillaries 235 extending along Z. Said capillaries are capable of guiding the emitted beams 74.

The electrical generator 16 comprises a first terminal 70, connected to the emission electrode 12, 212, and a second terminal 72 connected to the extraction electrode 14, 114, 214. The electrical generator 16 is in particular configured to allow a reversal of polarities between the first 70 and second 72 terminals.

The first terminal 70 is connected directly to the ionic liquid ion source 40 and in particular to the layer 42 of ionic liquid. In the embodiment of FIG. 1, the first terminal 70 is realized by a polarizing electrode 73 arranged in the reservoir 56. The second terminal 72 is connected to the edges of the grid 63 and of the sheet 65.

A method for utilizing the ion beam generator 10, 110, 210, will now be described, illustrated by experimental results obtained from the embodiment of FIG. 1.

First, a substrate 20 covered with nanowires 24 is provided. In the embodiment of FIG. 1, the nanowires are formed from gallium nitride by molecular beam epitaxy, as described below: a monocrystalline silicon substrate of crystalline orientation {111} is treated in situ by a nitriding or oxidation method to make the surface thereof insulating just before the nanowire epitaxy operation. The nanowires are produced, for example, using the molecular jet epitaxy technique which consists of directing flows of suitable atoms, here Ga and N, onto the surface of the Silicon {111} substrate, which is surface-nitrided. The deposited atoms reorganize on nucleation points distributed over the entire surface. The growth, the spacing, the diameter, the aspect ratio, the composition are controlled, for example, by adjusting the flow parameters of the atomic species and/or of the temperature.

A nanowire will grow perpendicular to the substrate by capturing the atomic species intentionally deposited and available by diffusion in its immediate vicinity. The intra-wire competition for capturing the atomic species deposited will regulate the growth mechanisms. The control of the deposited species addition function allows a precise control.

The nanowires 24 obtained are crystalline, therefore homogeneous. The diameter 27 has a low variability for a given method.

In the embodiment of FIG. 5, the trenches 230 are then cut out at the upper surface 22 of the substrate 20, for example with the aid of a standard silicon lithography technique.

Figures 6, 7:
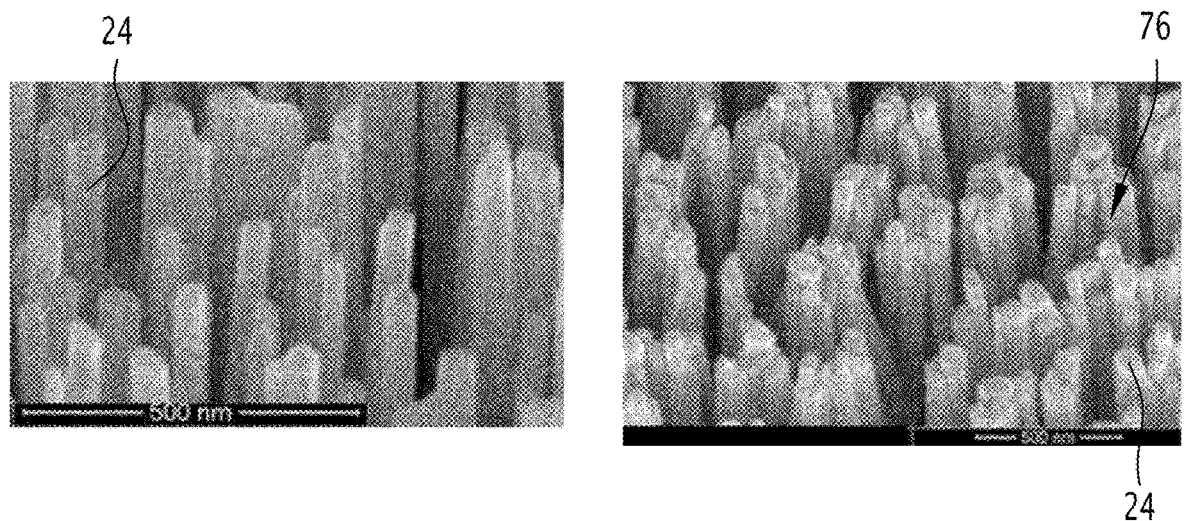
FIGS. 6 and 7 are electron microscope photographs representing detail views of the generator of FIG. 1, respectively before and after a first emission of ion beams.

FIG. 6 represents an electron microscope photograph of the nanowires 24 of a sample corresponding to the embodiment of FIG. 1, before the addition of the ionic liquid. In FIG. 6, it can be seen in particular that the nanowires 24 are distributed substantially regularly over the substrate and are spaced apart from one another.

In parallel, in the embodiment of FIG. 1, the casing 18 is produced. The substrate 20 is then fixed to the intermediate wall 50, then the emission cavity 54 is closed by assembling the casing 18 with the extraction electrode 14. The reservoir 56 is filled with ionic liquid 40 and assembled to the polarizing electrode 73.

The electrical generator 16 is then connected, on the one hand to the polarizing electrode 14, 114, 214 and on the other hand to the ionic liquid 40. In particular, in the embodiment of FIG. 1, the generator 16 is connected to the polarizing electrode 73.

A potential difference is then applied by said electrical generator 16. In the embodiment of FIG. 1, the thus-polarized ionic liquid 40 infiltrates into the emission cavity 54 through the pores 58 of the intermediate wall 50. The layer 42 is thus formed, impregnating at least partially the nanowires 24 and forming the first main surface 44 of the emission electrode 12.

Said first main surface 44 then emits ion beams 74 in the direction of the second main surface 60. Depending on the polarity of the first 70 and second 72 terminals, the beams are composed of positive ions or negative ions.

The substrate 20, the nanowires 24 and the walls of the emission cavity 54 are formed from materials with little or no conductivity. At the level of the emission electrode 12, 212, only the ionic liquid 40 is therefore polarized during the starting up of the electrical generator 16, which optimizes the efficiency of emission of the beams 74.

Figure 8:
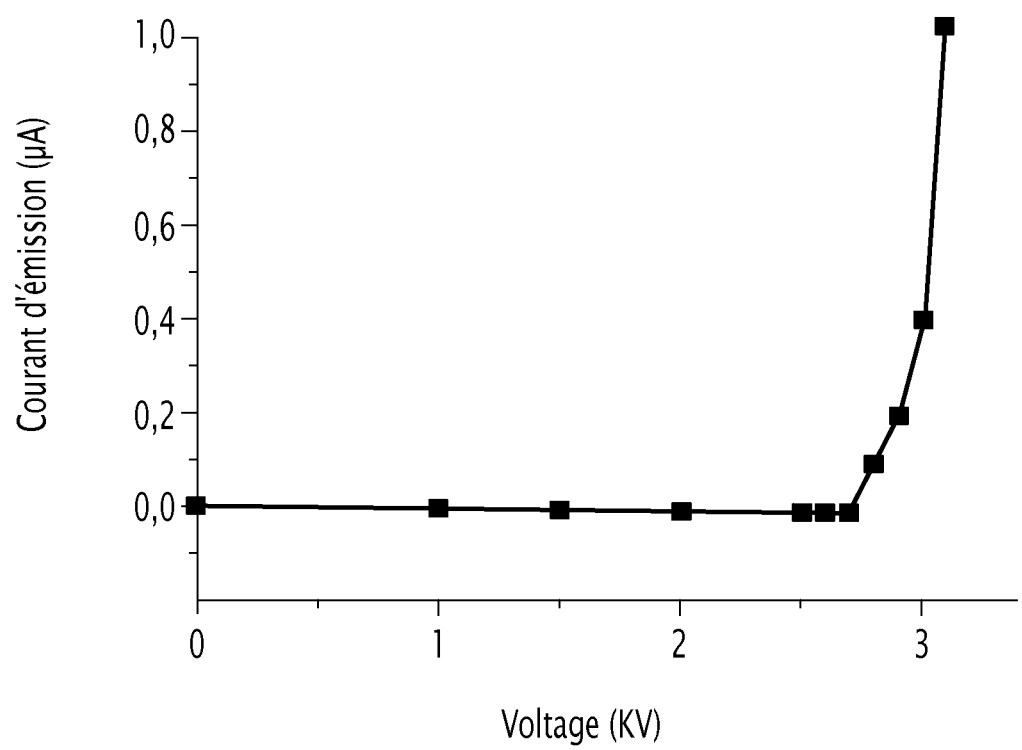
FIG. 8 is a graph representing a variation of an ion current emitted by the generator of FIG. 1 as a function of the potential difference applied between the electrodes.

FIG. 8 shows the variation of an ion current emitted by the generator 10 of FIG. 1 as a function of the potential difference applied between the first 70 and second 72 terminals of the electrical generator 16. The emission current is practically zero until a voltage of approximately 2.8 kV is obtained, beyond which the current increases rapidly.

The system has a long service life. In particular, the generator 10 of FIG. 1 has made it possible, experimentally, to emit for several hours without reversing the polarity of the first 70 and second 72 terminals.

An interpretation of the operation of the generator 10, 110, 210 is given below: during the deposition of the layer 42 on the substrate 20, or during the application of the potential difference by the electrical generator 16, nanowires 24 close to one another sag slightly onto one another, to form conical structures or bundles 76. Such bundles 76 can be observed in particular in FIG. 7, which represents an electron microscope photograph of the sample of FIG. 6 after emission of beams, cleaning and drying of the nanowires.

The number of nanowires 24 per bundle 76 varies in particular between a few units and a few tens. Optimally, the bundles 76 comprise between one and five tens of nanowires 24, grouped over a substantially circular surface of approximately 300 nm to 1 µm in diameter. Such an arrangement leads to a density of the order of $10^8$ emissive sites per $cm^2$ of substrate 20, which is greater than the results from known ion generators.

In the case of the generator 210 of FIG. 5, the presence of the trenches 230 preferentially leads each group 231 of nanowires 24 to form a distinct bundle 76, which makes it possible to control the size of said bundle. In addition, the trenches 230 form channels in which the ionic liquid 40 can circulate.

It is also possible to control the orientation of the nanowires 24 in order that the bundles 76 are formed spontaneously with an optimum size during the starting up of the electrical generator 16. Preferably, the nanowires 24 are formed so as to obtain a length 26 comprised between 100 nm and 1 µm, a diameter 27 of approximately 50 nm and a distance 28 between two adjacent nanowires of approximately 150 nm. Moreover, the nanowires 24 have a high rigidity, with a Young's modulus greater than or equal to 120 GPa and preferentially of the order of 150 GPa. Such a Young's modulus is in particular obtained for the nanowires made of GaN.

On a substrate 20 bearing such nanowires 24, the bundles 76 are formed by self-organization of said nanowires, without requiring the presence of trenches 230 organizing said nanowires into groups 231.

The electrostatic forces producing the emission of ions from an ionic liquid are very high, in particular of the order of $10^9$ V/m. Such forces applied to a set of nanowires 24 and to the layer 42 of ionic liquid are of a kind to induce a curvature, promoting the formation of Taylor cones 78 (FIGS. 4 and 5) on the first main surface 44 formed by the layer 42.

The bundles 76 make it possible to retain ionic liquid 40 in their inter-space, so as to cover each nanowire 24 with a fine layer of ionic liquid at the level of its free end. For an application in space propulsion, the fuel/ionic liquid must be fragmented into the most elementary possible particles in order to recover a maximum of thrust. The arrangement of the liquid in fine layers on the nanowires therefore promotes the efficiency of the ionic generator.

In addition, the bundles 76 ensure a physical protection of the ionic liquid against external disruptions, such as radiation.

The nanowires 24, formed from a material with little or no conductivity, escape the phenomena of degradation, or of formation of an interface layer, which can be observed in the case of the needles made of conductive material described in the document WO2016/164004.

Moreover, the nanowires 24 assembled in bundles allow, by capillary action, a renewal of the ionic liquid at the level of the tip of the Taylor cones. By a dilution phenomenon, this renewal avoids the saturation with counter ions at the level of said tips, which makes it possible to emit for a longer time without reversing the polarity of the electrical generator 16. An emission can in particular be maintained in a polarity of a given sign for several hours without evident degradation of the ionic liquid.

In addition, the current/voltage characteristic of the assembly of bundles remains practically constant over periods of several hours and for volumes of liquid of less than one ml spread over a surface of nanowires of the order of several $mm^2$.

Comparative tests were carried out with isolated nanowires 24, as opposed to the bundles structure 76. These tests showed that it was not possible to obtain covering of an isolated nanowire with a fine layer of ionic liquid by capillary action. The isolated nanowire is immersed under a drop of ionic liquid which does not allow a Taylor cone to stabilize. This results in an unstable emission of droplets of ionic liquid, which reduces the efficiency of the generator.

The operation of the ion beam generator according to the invention makes it possible in particular to emit ions for an extended period and to consume a large quantity of ionic liquid without degradation of the nanowires 24, unlike the metal tips described in the document WO2009/137583. Such properties make these generators particularly advantageous for the production of ion thrusters for spacecraft, such as microsatellites of the CubeSat type.

The total thrust provided by the thruster is proportional to the number of active sites ejecting ions. The very high number of emission sites linked to the bundles structure 76 is therefore favourable to thrust.

In addition, the Taylor cones obtained by the ion generators according to the invention are small and contain reduced volumes of ionic liquid. Such Taylor cones are known from the literature to be hydrodynamically more stable than large Taylor cones. The architecture of the ion generators according to the invention is therefore more energy-efficient and easier to manage, as the voltage is in particular less subject to a hysteresis phenomenon.

In the embodiment of FIG. 1, the emission cavity 54 is initially tightly closed by the sheet 65. This embodiment makes it possible to have a generator, the ionic liquid 40 of which is confined in a tight enclosure at the time when the satellite is launched. When the latter is in orbit, the generator 10 is activated, which forms openings in the sheet 65 under the effect of the ion beams 74. The sheet 65 is thus perforated opposite each bundle, forming a self-aligned system.

The embodiment of FIG. 4 is particularly suited to nanofabrication. According to a first variant of use, the ion beams 74 detach molecules from the second main surface 60 of the sample forming the extraction electrode 114. Such a use allows nanometric-scale production of the bas-relief patterns in the sample, said patterns corresponding to the contour 29 of the substrate 20.

According to a second variant of use of the embodiment of FIG. 4, the ion beans 74 allow charged molecules to leave the layer 42 of ionic liquid and become grafted onto the second main surface 60. Such a use makes it possible to produce nano-deposition patterns on the sample.

The choice of the ionic liquid and of the potential difference applied makes it possible to control the effect of the ion beams in terms of detaching or grafting the molecules.

The embodiment of FIG. 1 can also be used in nanofabrication, by having a target sample above the extraction electrode 14 in the form of a grid. Said extraction electrode is passed through by the beams before they reach a surface of the sample to be modified. The presence of an extraction electrode between the target and the emission electrode makes it possible to more precisely modulate the energy of the incident beam on the target.

The ion beam generator according to the invention thus finds an application in various fields, with an improved efficiency compared with the known ion emission devices.

The invention claimed is:

1. An ion beam generator, comprising:
an emission electrode comprising a first main surface;
an extraction electrode comprising a second main surface arranged substantially facing the first main surface, said first and second main surfaces being separated by a gap; and
an electrical generator capable of applying a potential difference between the emission electrode and the extraction electrode;
wherein:
the emission electrode comprises an ionic liquid ion source, said emission electrode being capable of sending at least one beam of ions originating from said ionic liquid to the extraction electrode;
the emission electrode has a substrate and a plurality of nanowires extending from said substrate, substantially in the direction of the extraction electrode, each of said nanowires having a length comprised between 50 nm and 50 µm, preferentially comprised between 100 nm and 1 µm, each of said nanowires having a diameter comprised between 50 nm and 200 nm, a minimum distance between two adjacent nanowires on the substrate being comprised between 50 nm and 200 nm and preferentially equal to approximately 150 nm;
the ionic liquid ion source has a layer of the ionic liquid formed on the substrate and at least partially immersing the nanowires, said layer of the ionic liquid being at least partially forming the first main surface; and
the plurality of nanowires and the substrate are electrically insulating or semiconducting, the electrical generator being connected to the layer of the ionic liquid.

2. The ion beam generator according to claim 1, in which the nanowires of the emission electrode are obtained by adding material to the substrate, said nanowires being preferentially produced by molecular beam epitaxy.

3. The ion beam generator according to claim 1, in which the nanowires are formed from a material selected from GaN, AN, InN, GaInN and AlGaN.

4. The ion beam generator according to claim 1, in which the substrate of the emission electrode is formed from a material comprising silicon.

5. The ion beam generator according to claim 1, in which the nanowires extend from a substantially flat surface of the substrate.

6. The ion beam generator according to claim 1, in which the ionic liquid is an onium salt, preferentially selected from 3-ethyl-1-methylimidazolium tetrafluoroborate and 3-ethyl-1 methylimidazolium bis(trifluoromethylsulfonyl) imide.

7. The ion beam generator according to claim 1, in which the gap separating the first and second main surfaces has a length comprised between 100 nm and 50 µm, preferentially comprised between 500 nm and 10 µm.

8. The ion beam generator according to claim 1, in which:
the length of a nanowire is comprised between 100 nm and 1 µm;
the diameter of a nanowire is approximately 50 nm;
the minimum distance between two adjacent nanowires on the substrate is approximately 150 nm; and
a Young's modulus of the nanowires is greater than or equal to 120 GPa and preferentially of the order of 150 GPa.

9. The ion beam generator according to claim 1, in which the extraction electrode comprises a grid preferentially formed from woven wires.

10. The ion beam generator according to claim 1, in which the extraction electrode comprises a sheet capable of being perforated by an ion beam originating from the emission electrode.

11. The ion beam generator according to claim 10, in which the emission electrode is arranged in a compartment tightly closed by the sheet.

12. An ion thruster comprising the ion beam generator according to claim 1.

13. A nanofabrication device comprising the ion beam generator according to claim 1.

* * * * *